United States Patent [19]
Abramsky et al.

[11] Patent Number: 5,809,400
[45] Date of Patent: Sep. 15, 1998

[54] INTERMODULATION PERFORMANCE ENHANCEMENT BY DYNAMICALLY CONTROLLING RF AMPLIFIER CURRENT

[75] Inventors: Victor A. Abramsky, Edison; Steven R. Bartholomew, Robbinsville; Andrzej Partyka, Bedminster, all of N.J.

[73] Assignee: Lucent Technologies Inc., Murray Hill, N.J.

[21] Appl. No.: 668,152

[22] Filed: Jun. 21, 1996

[51] Int. Cl.$^6$ .............................. H04B 1/10; H04B 15/00
[52] U.S. Cl. .......................... 455/63; 455/67.3; 455/135; 455/234.2; 455/278.1; 455/296; 330/129; 330/279
[58] Field of Search ......................... 455/63, 67.3, 135, 455/144, 234.2, 277.2, 278.1, 295, 296; 330/270, 86, 96, 97, 279, 129

[56] References Cited

U.S. PATENT DOCUMENTS

| | | | |
|---|---|---|---|
| 4,370,622 | 1/1983 | Hornbeck et al. | 330/207 |
| 4,602,218 | 7/1986 | Vilmur et al. | 330/279 |
| 5,101,173 | 3/1992 | Di Piazza et al. | 330/279 |
| 5,107,225 | 4/1992 | Wheatley, III et al. | 455/239.1 |
| 5,151,664 | 9/1992 | Suematsu et al. | 455/63 |
| 5,321,847 | 6/1994 | Johnson, Jr. | 455/63 |
| 5,359,607 | 10/1994 | Nguyen et al. | 455/226.1 |
| 5,383,223 | 1/1995 | Inokuchi | 330/279 |
| 5,469,115 | 11/1995 | Peterzell et al. | 330/129 |
| 5,513,387 | 4/1996 | Saito et al. | 455/243.1 |
| 5,652,547 | 7/1997 | Mokhatar | 330/279 |

Primary Examiner—Donnie L. Crosland
Attorney, Agent, or Firm—Steven R. Bartholomew

[57] ABSTRACT

Improved radio receiver designs are disclosed that can be used in the operational environment of wireless communications. The radio receiver includes a signal input terminal, a variable-current RF signal amplifier, a demodulator, and a controller. The variable-current RF signal amplifier has an input terminal for accepting RF input signals, an output terminal for generating an amplified version of the RF input signals, and a current control terminal for controlling the current consumption of the RF signal amplifier. The signal input terminal is coupled to the input terminal of the variable-current RF signal amplifier, the output terminal of the variable-current RF signal amplifier is coupled to the demodulator, and the current control terminal is coupled to the controller. The controller is also coupled to the demodulator. A received signal, including any noise and/or interference, is coupled to the signal input terminal. In response to signals amplified by the RF signal amplifier and demodulated by the demodulator, the controller controls the current consumed by the variable-current RF signal amplifier. The controller adjusts the current consumed by the RF signal amplifier to achieve at least a minimum acceptable signal-to-interference ratio for a desired signal, while the Noise Figure is not degraded any more than is necessary to achieve a minimum acceptable signal-to-interference ratio at any given time. In this manner, the variable current RF signal amplifier is adjusted to obtain a required amount of intermodulation performance for a given set of receiving conditions. This technique saves operating current and maintains fade margins because, in practice, interference conditions do not persist all of the time, and are usually of temporary duration.

21 Claims, 2 Drawing Sheets

FUZZY CONTROLLER RULES

| CONDITIONS $S_{Ic}$ | ACTION |
|---|---|
| + | INCREASE Ic IF SER AT SER METER 133 > A NOMINAL SER (SERnom) (OR IF C/N AT (C,N) METER 129 < A NOMINAL C/N (C/Nnom) |
| x | DECREASE Ic IF SER < SERnom (OR C/N > C/Nnom); (IF Ic > Icnom) |
| 0 | DECREASE Ic; (IF Ic > Icnom) | ns
INTERMODULATION PERFORMANCE ENHANCEMENT BY DYNAMICALLY CONTROLLING RF AMPLIFIER CURRENT

BACKGROUND

1. Field of the Invention

The invention relates generally to radio receivers, and more specifically to radio receivers that are used for wireless communications.

2. Description of Related Art

The field of wireless communications is experiencing rapid growth. An ever-increasing number of radio communications systems are placed into use every day, from public safety communications systems operated by police and fire departments, to business communications systems and commercial broadcast stations. Existing cellular networks in many metropolitan areas are reaching capacity, and new cell sites are being added on an ongoing basis. Moreover, in order to increase the capacity of cellular communications systems, present efforts are being directed towards new modulation schemes, such as CDMA and TDMA, which require the use of relatively broadband radio receiver designs. Consequently, present-day radio receivers must be able to effectively discriminate against many sources of interference.

The extent to which a radio receiver is immune to RF interference from nearby transmitters is determined by the intermodulation distortion characteristics of the receiver. As a general matter, broadband receivers are more susceptible to intermodulation distortion than narrowband receivers. These intermodulation distortions occur at the receiver front-end when the front end is exposed to strong undesired out-of-band signals as, for example, when the receiver is in close proximity to a cell site transmitter other than that from which the receiver is currently receiving a radio signal.

One conventional technique for improving intermodulation distortion problems addresses the design of the receiver front end. As a general matter, intermodulation performance can be improved by increasing the quiescent operating current of the active RF device or devices in the receiver front end. In order to obtain acceptable intermodulation performance in many real-world environments, the quiescent operating current must often be increased to an undesirably high level. In the case of stationary equipment connected to a 120-volt mains supply, the use of such a high current generally poses no great problem. However, a different situation exists with respect to portable equipment, where such a high current drain would very quickly deplete a set of fresh batteries. The user is inconvenienced by having to frequently change and/or recharge batteries. Such batteries may be expensive, and, if not, the frequent purchase of inexpensive batteries may also prove costly. Moreover, the user may be faced with a set of dead batteries in an emergency situation. What is needed is a technique for improving intermodulation performance while, at the same time, not significantly increasing the current consumption of the receiver.

Improved radio receiver designs are disclosed that can be used in the operational environment of wireless communications. The radio receiver includes a signal input terminal, a variable-current RF signal amplifier, a demodulator, and a controller. The variable-current RF signal amplifier has an input terminal for accepting RF input signals, an output terminal for generating an amplified version of the RF input signals, and a current control terminal for controlling the current consumption of the RF signal amplifier. The signal input terminal is coupled to the input terminal of the variable-current RF signal amplifier, the output terminal of the variable-current RF signal amplifier is coupled to the demodulator, and the current control terminal is coupled to the controller. The controller is also coupled to the demodulator. A received signal, including any noise and/or interference, is coupled to the signal input terminal. In response to signals amplified by the RF signal amplifier and demodulated by the demodulator, the controller controls the current consumed by the variable-current RF signal amplifier. The controller adjusts the current consumed by the RF signal amplifier to achieve at least a minimum acceptable signal-to-interference ratio for a desired signal, while the Noise Figure is not degraded any more than is necessary to achieve a minimum acceptable signal-to-interference ratio at any given time. In this manner, the variable current RF signal amplifier is adjusted to obtain a required amount of intermodulation performance for a given set of receiving conditions. This technique saves operating current and maintains fade margins because, in practice, interference conditions do not persist all of the time, and are usually of temporary duration.

According to a further embodiment, the controller operates in the environment of an existing control loop, and provides a novel additional control loop. The existing control loop includes a mixer coupled to the output terminal of the RF signal amplifier, a variable gain IF amplifier coupled to the mixer, and a detector in the form of a rake receiver coupled to the variable gain IF amplifier. The rake receiver includes an A-to-D converter and a rake correlator, and may, but need not, include an I/Q separator and an IF-to-baseband downconverter. The output of the rake correlator may be compared with the output of the A-to-D converter to determine a signal C/N (carrier-to-noise) ratio. The existing control loop adjusts the gain of the variable gain IF amplifier to maintain a constant (Signal+Noise) level at the A-to-D converter.

The novel additional control loop controls the current in the RF signal amplifier in order to maintain the received signal quality above a nominal level and the current consumption as close as possible to a low nominal level. The controller uses the additional control loop to maintain the symbol error rate (SER) and/or the carrier to noise ratio (C/N) at a desired level. This embodiment is useful for improving the overall signal handling capability of a receiver, in that a strong desired signal is often accompanied by the presence of relatively strong undesired RF signals (i.e., interfering signals). Under these circumstances, additional RF amplifier current improves receiver performance.

DETAILED DESCRIPTION OF THE PREFERRED EMBODIMENTS

Figure 1:
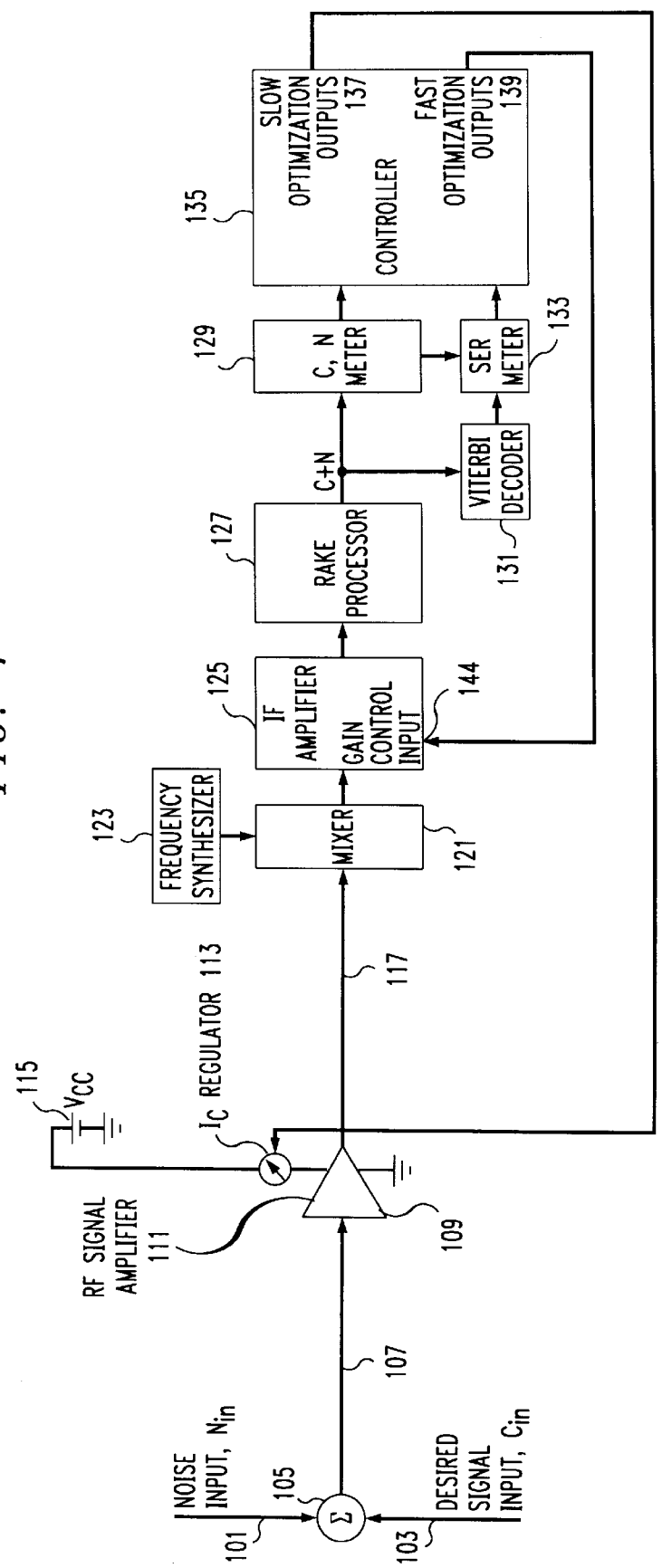
FIG. 1 is a hardware block diagram setting forth an illustrative embodiment of the invention disclosed herein.

FIG. 1 is a hardware block diagram setting forth an embodiment of the invention disclosed herein. Although the hardware configuration of FIG. 1 may be conceptualized as representing a receiver in a wireless telephone, the techniques disclosed herein are applicable to virtually any type of receiver. For example, the present invention encompasses not only receivers that are used in wireless telephone devices, but also receivers used by law enforcement agencies, public safety organizations, businesses, aircraft pilots, maritime operators, and the public at large, including consumer products such as stereos, car radios, shortwave radios, AM/FM radios, or the like.

In practical, real-world environments, the receiver of FIG. 1 receives a desired signal along with a certain amount of noise. Therefore, the input of a receiver may be conceptualized as a summer 105 that receives two inputs: a first input 101 that represents the sum of all sources of noise and interference including intermodulation interference, and a second input 103 that represents a desired signal. The intermodulation interference is actually generated in the receiver, but is shown here as already present at the input of the receiver for conceptual simplification. This conceptualization, known as "referring to the input", implies that a component, such as noise or interference, normally generated within the receiver, is shown as being applied to the input of the receiver, while the receiver is assumed to generate none of that component. The output of the summer 105 is fed to the input terminal 107 of an RF signal amplifier 111. The current consumed by the RF signal amplifier 111 may be adjusted to a desired level via an amplifier current ($I_c$) regulator 113 that is placed in series with a voltage source Vcc 115 that supplies DC power to the RF signal amplifier.

The RF output terminal 117 of the RF signal amplifier 111 is coupled to a first input port of a mixer 121, and the output of a frequency synthesizer 123 is fed to a second input port of the mixer 121. Conventional devices well-known to those skilled in the art may be employed for mixer 121 and frequency synthesizer 123. In general, frequency synthesizer 123 includes a voltage-controlled oscillator, a phase comparator, a phase-lock loop, a buffer amplifier, and one or more multipliers/dividers. The fluction of frequency synthesizer 123 is to generate an RF carrier at a certain frequency such that, when the carrier and the desired signal are mixed at mixer 121, a specified frequency component appears at the output of mixer 121.

The output of mixer 121 is fed to the input of an intermediate frequency (IF) amplifier 125 having a gain control input 144 line which is used to control the gain, gamma, of the IF amplifier 125. Since the IF amplifier 125 output is typically fed to some type of detector (demodulator) stage, it is desirable for the output of the IF amplifier to be held at a relatively constant value. For example, if the IF amplifier 125 is used in a CDMA (code division multiple access) wireless telephone device, this detector stage is present in the form of a rake processor 127. One function of the gain control input 144 line is to permit the adjustment of IF amplifier 125 gain, such that a relatively constant signal level is present at the output of the IF amplifier, irrespective of the actual signal level at the output of mixer 121. In this manner, the receiver compensates for signal fluctuations in the total received (signal+noise+ distortion) power at the output of summer 105 by adjusting the gain of the IF amplifier 125 to track received power changes. The received power can change due several reasons such as, for example, multipath fading, moving the receiver through an area having various terrain obstructions, moving the receiver towards, or away from, the cell site, and/or changing signal propagation or interference conditions. Note that the gain control input 144 line may be used to maintain the level of the desired signal, denoted as C, substantially at a constant level. Alternatively, the gain control input 144 line may be used to maintain a constant level of (desired signal+ noise), denoted as (C+N).

The rake processor 127 is a digital signal processor designed to demodulate digitally-modulated signals such as CDMA spread spectrum signals. Note that, since the output of IF amplifier 125 is generally in analog form, an A/D converter is used at the output of the IF amplifier 125 to convert these analog signals to digital form. The A-to-D converter may be preceded by an IF-to-baseband downconverter and/or an I/Q separator. For purposes of the present example, the A/D converter, as well as any components between the A-to-D converter and the IF amplifier, are considered to be a part of the rake processor 127. The function and construction of rake processor 127 are well known to those skilled in the art and do not require additional explanation.

The output of rake processor 127, including noise components, denoted as N, along with desired signal components, denoted as C, is fed to both a Viterbi decoder 131 and a (C,N) meter 129. The Viterbi decoder 131 retrieves the digital information included in the desired signal components C, and the (C,N) meter 129 measures the level of C, as well as the level of N, present at the output of the rake processor 127. The output of Viterbi decoder 131 is passed to a signal error rate (SER) meter 133 which measures the error rate of the digital information decoded by Viterbi decoder 131. The signal error rate can be obtained from the Viterbi decoder 131 by re-encoding the decoded packets and comparing the resulting symbols with the received symbols.

The output of SER meter 133 and/or the output of (C,N) meter 129 are coupled to respective inputs of controller 135. Controller 135 includes a processing device, such as a microprocessor, and may optionally include logic gates, flip-flops, buffers, comparators, operational amplifiers, and/ or resistive networks. The function of controller 135 is to monitor the outputs of (C,N) meter 129 and/or SER meter 133 and, in response to these outputs, generate a group of first control signals and a second control signal. The group of first control signals may be a function of the (C,N) meter 129 output only, the SER meter 133 output only, or a function that includes both the (C,N) meter 129 output and the SER meter 133 output. The second control signal keeps the received power level constant at the input to the rake receiver 127.

The controller 135 places the group of first control signals on a group of output lines termed the slow optimization outputs 137. The second control signal is placed on an output line termed the fast signal tracking output 139. To this end, the controller 135 generates the group of first control signals to compensate for relatively slow variations in the interference which generates intermodulation distortion.

A slow optimization output 137 is coupled to the $I_c$ regulator 113, and is used to control the amount of current drawn by the RF signal amplifier 111. In this manner, controller 135 adjusts current regulator 113 in response to signals received from (C,N) meter 129 and/or SER meter 133.

A first control loop includes the output of the (C,N) meter 129, and/or the output of the SER meter 133, coupled to controller 135, where controller 135 uses one or both of these outputs to control the slow optimization outputs 137 that are applied to the $I_c$ regulator 113 for RF signal amplifier 111. The function of the second control loop, which could also be termed an AGC loop, is to react fast to changing signal values. The function of the first control loop, which could also be termed an optimizing loop, is to react to changing signal conditions. In operation, controller 135 adjusts the value of the RF signal amplifier 111 DC current consumption to optimize receiver performance for the present set of receiving conditions as reflected in the outputs of the SER meter 133 and/or the (C,N) meter 133. In one preferred implementation, a fuzzy logic controller is used in controller 135. A simple and robust control is obtained based on a few predefined rules which the controller 135 uses in the receiver optimization process. The value of amplifier current is optimized for a given set of receiving conditions, irrespective of receiver component variations due to manufacturing processes and temperature excursions.

It is to be understood that the hardware block diagram of FIG. 1 is presented for purposes of illustration. The principles of the invention disclosed herein are applicable to any radio receiver design that has an RF amplifier and a detector, or equivalent elements. Therefore, the invention is applicable to direct-conversion receiver designs that do not use IF amplifier stages or mixers. The invention is also applicable to radio receiver designs that do use IF amplifiers and/or mixers, and to radio receivers that use a mixer and/or a converter stage at the front end instead of an RF signal amplifier per se. If a mixer and/or converter stage is used in lieu of an RF signal amplifier, the current of such a mixer and/or converter is adjusted in a manner as described herein with reference to RF signal amplifier current.

Although the block diagram of FIG. 1 shows a receiver design adapted for use with CDMA wireless telephonic devices, including a rake processor 127, an SER meter 133, a C/N meter 129, and a Viterbi decoder 131, these elements are not required. For example, a radio receiver design for FM broadcast use may include a ratio detector stage, or a quadrature detector stage, in lieu of the aforementioned blocks used in the CDMA wireless telephone. In the case of an FM broadcast receiver, the controller 135 measures the quieting of the radio receiver at the output of the quadrature detector, and adjusts the current of the adjustable current RF signal amplifier to achieve at least a desired amount of quieting. In the case of a receiver designed to receive AM or SSB broadcasts, the receiver generally includes an envelope detector after the IF amplifier, and the controller would then adjust the current of the adjustable current RF signal amplifier 111 based upon the signal-to-noise ratio of the desired signal at the output of the envelope detector.

Figures 2, 3:
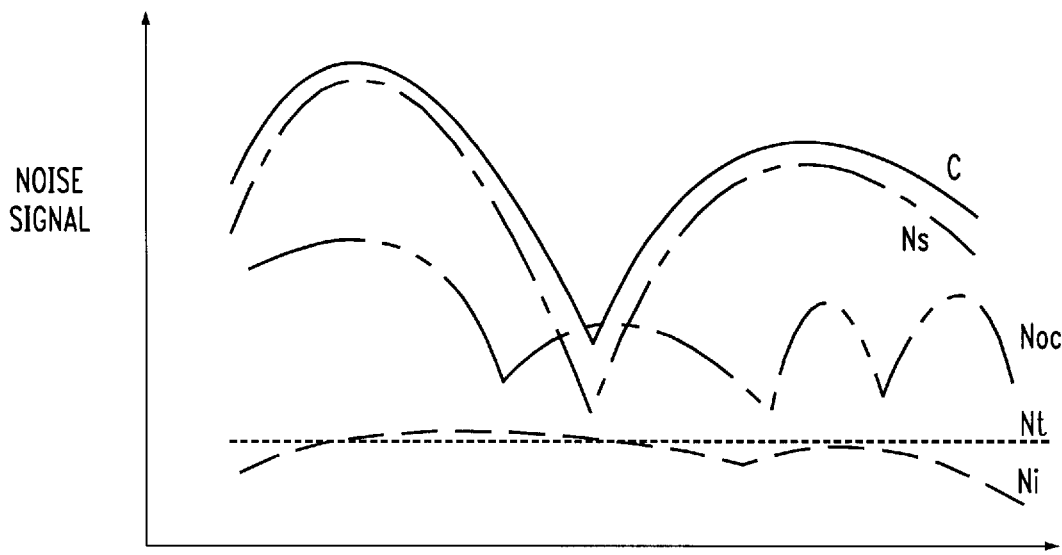
FIG. 2 is a graph depicting the relative magnitude of a desired signal, and the relative magnitudes of various sources of noise and interference, versus time, for a typical radio receiving environment.
FIG. 3 is a table that describes a method for selecting an appropriate value for RF amplifier current using an illustrative set of fuzzy controller rules which the controller of FIG. 1 is programmed to implement.

The receiver of FIG. 1 may be employed in a mobile environment of CDMA telephony where the field strength of the signal to be received, as well as the received noise, fluctuates with time and/or distance. Refer to FIG. 2 which illustrates typical variations of received signal strength and received noise components. In the operational environment of CDMA, these noise components include:

Self induced noise from other users of the same CDMA channel—Ns. Note that this noise tracks the received signal power.

Noc—Noise from other CDMA cells which are relatively far away, but at the same frequency as the desired signal; this noise is subject to fading in the same way as the desired signal. However, these variations are not correlated with the variations in the desired signal.

Nt—thermal noise from the receiver front-end; this value is determined by the receiver noise figure (NF) which, in turn, is determined by the amount of current drawn by RF signal amplifier 111 and controlled by Ic regulator 113.

Ni—intermodulation products caused by strong-out-of-band signals and nonlinearities in the front-end. The levels of these intermodulation products depend upon Ic. Ni is referenced to the antenna input.

Most of these components are varying relatively fast when the receiver is in motion, such as, for example, in a car. However, the signal and noise conditions (average values, Doppler frequency etc.) are relatively slow-varying.

FIG. 3 is a table that describes an illustrative set of fuzzy controller rules which controller 135 may be programmed to implement. In FIG. 3, the symbol $S_{Ic}$ denotes the sensitivity of a specified control parameter to changes in the parameter Ic. These sensitivities are defined as: $Sx = Sign(66\ x)^* \{SER(x_0) - SER(x_0 + \Delta x)\}$; where x denotes the changing parameter (Ic). Pursuant to a first embodiment, symbol error rate (SER) is used as the control parameter. The SER meter 133 (FIG. 1) obtains SER from the Viterbi decoder 131 by reencoding the decoded packets and comparing the resulting symbols with the received symbols. Alternatively, pursuant to a second embodiment, signal-to-noise ratio (C/N) is used as the control parameter. The signal-to-noise ratio is measured by the (C,N) meter 129 at the rake processor 127 output.

As used in FIG. 3, the symbol + means positive sensitivity, − means negative sensitivity, and x means "don't care". The sensitivity, Sx, is obtained by perturbing the parameter x and measuring the resulting difference in SER. Due to signal fluctuation, filtering (e.g. averaging) is performed to obtain Sx. In effect, the parameter x is dithered around its current nominal value. The amount of dither ($\Delta x$) is an important value which is carefully determined in order to optimize the response time of the controller 135 (FIG. 1). Note that controller 135 response can be improved if the changes made to x are proportional to the sensitivity Sx.

The controller 135 response time can be improved if the present amount of intermodulation distortion (the IM value) is estimated, and Ic is preset to suppress exactly this value of IM, before the recursive optimization begins. This method can be used in conjunction with the fuzzy controller method described above as a way to quickly estimate the initial value of $I_c$ before beginning the optimization procedure that uses fuzzy control rules. This will speed up the response time of controller 135 in the aforementioned set of circumstances.

Although the examples described above in connection with FIG. 1 utilize an adjustable current RF signal amplifier with a fixed gain and an adjustable current consumption, the invention also encompasses other structural topologies. Furthermore, although some of the examples described herein operate in the environment of CDMA wireless telephony, these techniques are also applicable to radio receivers other than CDMA.

We claim:

1. A radio receiver comprising:
   (a) a signal input terminal,
   (b) a variable-current RF signal amplifier,
   (c) a demodulator, and
   (d) a controller,
      wherein the variable-current RF signal amplifier has an input terminal for accepting RF input signals, an output terminal for generating an amplified version of the RF input signals, and a current control terminal for controlling the current consumption of the RF signal amplifier so as to achieve no greater than a specified amount of receiver intermodulation distortion, and
      wherein the signal input terminal is coupled to the input terminal of the variable-current RF signal amplifier, the output terminal of the variable-current RF signal amplifier is coupled to the demodulator, the current control terminal is coupled to the controller, and the controller is coupled to the demodulator.

2. A method for use with a radio receiver comprising a signal input terminal, a variable-current RF signal amplifier, a demodulator, and a controller, wherein the variable-current RF signal amplifier has (i) an input terminal for accepting RF input signals, (ii) an output terminal for generating an amplified version of the RF input signals, and (iii) a current control terminal for controlling the current consumption of the RF signal amplifier, and wherein the signal input terminal is coupled to the input terminal of the variable-current RF signal amplifier, the output terminal of the variable-current RF signal amplifier is coupled to the demodulator, the current control terminal is coupled to the controller, and the controller is coupled to the demodulator; THE METHOD INCLUDING THE STEPS OF:

(a) coupling a received signal, including any noise and/or interference, to the signal input terminal;

(b) the controller controlling the amount of current consumed by the variable-current RF signal amplifier in response to signals amplified by the RF signal amplifier and demodulated by the demodulator, so as to achieve no greater than a specified amount of receiver intermodulation.

3. The method of claim 2 wherein the controller adjusts the current consumed by the RF signal amplifier such that, in the presence of receiver intermodulation, at least a minimum acceptable signal-to-interference ratio is achieved for a received signal as demodulated by the demodulator.

4. The method of claim 2 wherein the controller adjusts the current consumed by the RF signal amplifier such that, in the presence of receiver intermodulation, Noise Figure of the RE signal amplifier is not degraded substantially more than is necessary to substantially achieve a specified signal-to-interference ratio at the output of the demodulator.

5. The method of claim 2 wherein the controller adjusts the current consumption of the variable current RF signal amplifier to obtain a specified amount of intermodulation performance for a specified set of received signals.

6. The method of claim 2 wherein the controller adjusts the current consumption of the variable current RF signal amplifier to substantially minimize symbol error rate (SER) of the detected signal.

7. The method of claim 2 wherein the controller adjusts the current consumption of the variable current RE signal amplifier to substantially maximize signal-to-noise S/N ratio of the detected signal.

8. The method of claim 6 wherein magnitude and direction of changes in symbol error rate (SER) are determined by the controller dithering the DC current consumption of the variable current RF signal amplifier.

9. The method of claim 7 wherein magnitude and direction of changes in signal-to-noise ratio of the desired signal are determined by the controller dithering the DC current consumption of the variable current RF signal amplifier.

10. The method of claim 9 wherein the controller adjusts a third-order intercept point of the radio receiver based upon a set of fuzzy logical rules applied to the signal-to-noise ratio of the desired signal.

11. The method of claim 8 wherein the dithering is performed by incrementing and/or decrementing the current consumption of the variable current RF signal amplifier, such that the increments and/or decrements are related to the sensitivity of the SER to incremental changes in the current consumed by the variable current RF signal amplifier.

12. The method of claim 9 wherein the dithering is performed by incrementing and/or decrementing the current consumed by the variable current RF signal amplifier, such that the increments and/or decrements are related to the sensitivity of the signal-to-noise ratio to incremental changes in the current consumed by the variable current RF signal amplifier.

13. The method of claim 9 wherein the controller adjusts a third-order intercept point of the radio receiver based upon one or more logical rules applied to the signal-to-noise ratio of the desired signal.

14. The method of claim 11 wherein the processor adjusts the third-order intercept point of the radio receiver based upon one or more logical rules applied to the symbol error rate (SER) of the desired signal.

15. A method of estimating receiver intermodulation for a radio receiver having an RF signal amplifier, an antenna input terminal, an adjustable current regulator for adjusting DC current consumption of the RF signal amplifier, and a processor for adjusting the adjustable current regulator, for measuring signal-to-noise ratio of a desired signal, and for measuring signal strength of the desired signal, THE METHOD INCLUDING TBE STEPS OF:

(a) the processor measuring the received signal strength and the signal-to-noise ratio of the desired signal;

(b) the processor estimating receiver-generated thermal noise based on current regulated by the adjustable current regulator, and adjusting the adjustable current regulator in response to the measurements of received signal strength and signal-to-noise ratio to achieve no more than a specified amount of receiver intermodulation.

16. The method of claim 15 wherein the radio receiver is adapted for use with a CDMA (code division multiple access) wireless telephone system and the processor includes means for measuring the neighbor pilot strength of a CDMA RF carrier signal, the method further including the step of the processor estimating receiver intermodulation based upon measurements of the neighbor pilot strength.

17. The method of claim 16 wherein the radio receiver includes a rake receiver having a plurality of rake fingers, each rake finger including signal strength measuring means for measuring the signal strength of the desired signal during a corresponding time duration, the method further including the step of the processor estimating receiver intermodulation based upon measurements of signal strength at each of a plurality of rake fingers.

18. A method of estimating the amount of intermodulation distortion present in a radio receiver as set forth in claim 15 including the steps of the processor adjusting the intermodulation distortion performance of the radio receiver by:

(a) the processor measuring the received signal strength and the signal-to-noise ratio of the desired signal;

(b) estimating receiver-generated thermal noise as set forth in claim 15;

(c) the processor adjusting the adjustable current regulator in response to the measurements of received signal strength and signal-to-noise ratio.

19. The method of claim 18 wherein the radio receiver is adapted for use with a CDMA (code division multiple access) wireless telephone system and the processor includes means for measuring the neighbor pilot strength of a CDMA RF carrier signal, the method further including the step of the processor estimating receiver intermodulation based upon measurements of the neighbor pilot strength.

20. The method of claim 18 wherein the radio receiver includes a rake receiver having a plurality of rake fingers, each rake finger including signal strength measuring means for measuring the signal strength of the desired signal during a corresponding time duration, the method further including the step of the processor estimating receiver intermodulation based upon measurements of signal strength at each of a plurality of rake fingers.

21. A method for use with a radio receiver having an antenna input terminal, an RF signal amplifier, an amplifier current regulator coupled to the RF signal amplifier for regulating the amount of DC current consumed by the RE signal amplifier, and processing means for controlling the current regulator, THE METHOD INCLUDING THE STEPS OF:

(a) the receiver receiving a plurality of signals including a desired signal; and (b) the processor adjusting the current regulator to achieve no greater than a specified amount of receiver intermodulation interference upon reception of the desired signal.

\* \* \* \* \*